United States Patent
Petrick et al.

(10) Patent No.: US 7,132,667 B2
(45) Date of Patent: Nov. 7, 2006

(54) METHOD AND APPARATUS FOR IMPROVED DATA ACQUISITION USING A SOLID STATE DIGITAL X-RAY DETECTOR

(75) Inventors: Scott William Petrick, Sussex, WI (US); Alan Dean Blomeyer, Milwaukee, WI (US); Jingyi Liang, Waukesha, WI (US); Richard Gordon Cronce, New Berlin, WI (US)

(73) Assignee: General Electric Company, Schenectady, NY (US)

( * ) Notice: Subject to any disclaimer, the term of this patent is extended or adjusted under 35 U.S.C. 154(b) by 257 days.

(21) Appl. No.: 10/841,010

(22) Filed: May 7, 2004

(65) Prior Publication Data

US 2005/0173642 A1 Aug. 11, 2005

Related U.S. Application Data

(60) Provisional application No. 60/543,762, filed on Feb. 11, 2004.

(51) Int. Cl.
*G01T 1/24* (2006.01)
(52) U.S. Cl. ................................. 250/370.09
(58) Field of Classification Search ........... 250/370.09; 378/98.8
See application file for complete search history.

(56) References Cited

U.S. PATENT DOCUMENTS

| | | | |
|---|---|---|---|
| 6,415,049 B1 * | 7/2002 | Yanagita et al. | 382/132 |
| 6,718,010 B1 * | 4/2004 | Petrick et al. | 378/98.8 |
| 2002/0181654 A1 * | 12/2002 | Baertsch et al. | 378/98.8 |
| 2003/0227997 A1 * | 12/2003 | Petrick et al. | 378/98.8 |
| 2005/0121616 A1 * | 6/2005 | Petrick | 250/370.09 |

* cited by examiner

*Primary Examiner*—Otilia Gabor
(74) *Attorney, Agent, or Firm*—McAndrews, Held & Malloy, Ltd.; Peter J. Vogel; Michael A. Dellapenna (57) ABSTRACT

Certain embodiments provide a method and system for improved x-ray image data acquisition using a digital x-ray detector. The method and system include defining groups of scan lines in a detector, associating data lines in the detector with the groups of scan lines, and reading image data from the groups of scan lines using the associated data lines. The scan lines are connected with a plurality of pixels. A region of interest may be defined in the detector. The pixels obtain image data regarding the region of interest. The image data may be read from at least one scan line in each of the groups of scan lines using the associated data lines. Alternatively, the image data may be read from alternating groups of the scan lines using the associated data lines. Image data may also be binned from adjacent pixels read using a plurality of data lines.

24 Claims, 7 Drawing Sheets

Plan View Of A Cluster Of Pixels Grouped In 4 Rotating Pairs Of Scan Lines With Associated (Unsplit) Data Lines

Partial Schematic of Detector With Split Data Lines

FIG. 4

Partial Schematic of Detector With Alternating Groups (Of 2) Scan Lines With Split Data Lines

FIG. 5

Plan View Of A Cluster Of Pixels Grouped In Pairs Of Scan Lines With Associated (Split) Data Lines

FIG. 6

Plan View Of A Cluster Of Pixels Grouped In 4 Rotating Pairs
Of Scan Lines With Associated (Unsplit) Data Lines

FIG. 7

METHOD AND APPARATUS FOR IMPROVED DATA ACQUISITION USING A SOLID STATE DIGITAL X-RAY DETECTOR

RELATED APPLICATIONS

The present application relates to, and claims priority from, U.S. Provisional Application No. 60/543,762 filed on Feb. 11, 2004, and entitled "Method and Apparatus for Improved Data Acquisition Using a Solid State Digital X-ray Detector".

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

The present invention generally relates to x-ray imaging. In particular, the present invention relates to improved x-ray image data acquisition using a digital x-ray detector.

X-ray images may be used for many purposes. For instance, internal defects in an object may be detected. Additionally, changes in internal structure or alignment may be determined. Furthermore, the image may show the presence or absence of internal structures in the object. The information gained from x-ray imaging has applications in many fields, including medicine and manufacturing.

X-ray imaging systems are commonly used to capture, for example, thoracic, cervical, spinal, cranial, and abdominal images that often include information necessary for a doctor to make an accurate diagnosis. X-ray imaging systems typically include an x-ray source and an x-ray detector. When having a thoracic x-ray image taken, for example, a patient stands with his or her chest against the x-ray detector as an x-ray technologist positions the x-ray detector and the x-ray source at an appropriate height. X-rays produced by the source travel through the patient's chest, and the x-ray detector then detects the x-ray energy generated by the source and attenuated to various degrees by different parts of the body. An associated control system obtains the detected x-ray energy from the x-ray detector and prepares a corresponding diagnostic image on a display.

The x-ray detector may be an amorphous silicon flat panel detector, for example. Amorphous silicon is a type of silicon that is not crystalline in structure. Image pixels are formed from amorphous silicon photodiodes connected to switches on the flat panel. A scintillator is placed in front of the flat panel detector. The scintillator receives x-rays from an x-ray source and emits light in response to the x-rays absorbed. The light activates the photodiodes in the amorphous silicon flat panel detector. Readout electronics obtain pixel data from the photodiodes through data lines (columns) and scan lines (rows). Images may be formed from the pixel data. Images may be displayed in real time. Flat panel detectors may offer more detailed images than image intensifiers. Flat panel detectors may allow faster image acquisition than image intensifiers.

A solid state flat panel x-ray detector typically includes an array of picture elements (pixels) composed of Field Effect Transistors (FETs) and photodiodes. The FETs serve as switches, and the photodiodes are light detectors. The array of FETs and photodiodes may be composed of amorphous silicon. A compound such as Cesium Iodide (CsI) is deposited over the amorphous silicon. CsI absorbs x-rays and converts the x-rays to light. The light is then detected by the photodiodes. The photodiode acts as a capacitor and stores charge.

Initialization of the detector occurs prior to an x-ray exposure. During an initialization of the detector, the detector is "scrubbed" prior to an x-ray exposure. During scrubbing, each photodiode is reverse biased and charged to a known voltage. The detector is then exposed to x-rays which are absorbed by the CsI deposited on the detector. Light that is emitted by the CsI in proportion to x-ray flux causes the affected photodiodes to conduct, partially discharging the photodiode. After the conclusion of the x-ray exposure, a voltage on each photodiode is restored to an initial voltage. An amount of charge to restore the initial voltage on each affected photodiode is measured. The measured amount of charge becomes a measure of an x-ray dose integrated by a pixel during the length of the exposure.

The detector is read or scrubbed according to the array structure. That is, the detector is read on a scan line by scan line basis. A FET switch associated with each photodiode is used to control reading of photodiodes on a given scan line. Reading is performed whenever an image produced by the detector includes data, such as exposure data and/or offset data. Scrubbing occurs when data is to be discarded from the detector rather than stored or used to generate an image. Scrubbing is performed to maintain proper bias on the photodiodes during idle periods. Scrubbing may also be used to reduce effects of lag or incomplete charge restoration of the photodiodes, for example. Scrubbing restores charge to the photodiodes but the charge may not be measured. If the data is measured during scrubbing, the data may simply be discarded.

Switching elements in a solid state x-ray detector minimize a number of electrical contacts made to the detector. If no switching elements are present, at least one contact for each pixel is present in on the detector. Lack of switching elements may make the production of complex detectors prohibitive. Switching elements reduce the number of contacts to no more than the number of pixels along the perimeter of the detector array. The pixels in the interior of the array are "ganged" together along each axis of the detector array. An entire row of the array is controlled simultaneously when the scan line attached to the gates of the FETs of pixels on that row is activated. Each of the pixels in the row is connected to a separate data line through a switch. The switch is used by read out electronics to restore charge to the photodiode. As each row is activated, all of the pixels in the row have the charge restored to the respective photodiodes simultaneously by the read out electronics over the individual data lines. Each data line typically has a dedicated read out channel associated with the data line.

Image quality is an important criterion for a solid state x-ray detector design. In order to maximize image quality, noise generated by the read out electronics should be minimized. Furthermore, electronic noise affecting an image may be influenced by the resistance and capacitance of data lines reading out data from the detector array. To reduce the effect of data line resistance and capacitance on image noise, the data lines of the detector array may be split in half to reduce data line length. A shorter data line reduces the resistance and capacitance of each data line. Read out electronics may be added to two sides of the detector, rather than one side, to read the split data lines. However, the read out electronics with split data lines may operate at only half the speed of read out electronics with unsplit data lines to achieve the same detector read out rate.

Additionally, the detector electronics may be constructed in basic building blocks to provide modularity and ease of reconfiguration. Scan drivers, for example, may be modularized into a small assembly that incorporates drivers for 256 scan lines, for example. The read out channels may be modularized into a small assembly that would read and convert the signals from, for example, 256 data lines. The size, shape, architecture and pixel size of various solid state detectors applied to various imaging systems determine the arrangement and number of scan modules and data modules to be used.

A control board is used to read the detector. Programmable firmware may be used to adapt programmable control features of the control board for a particular detector. Additionally, a reference and regulation board (RRB) may be used with a detector to generate noise-sensitive supply and reference voltages (including a dynamic conversion reference) used by the scan and data modules to read data. The RRB also distributes control signals generated by the control board to the modules and collects data returned by the data modules. Typically, the RRB is designed specifically for a particular detector. An interface between the control board and the RRB may be implemented as a standard interface such that signals to different detectors are in a similar format.

Reading the detector may be accomplished as a pipelined process originating the data modules. As each scan line is activated (scan line N, for example), a data module read out channel acquires a signal (charge, for example) from the pixel on its data line that is activated by scan line N. While the data module is converting the charge acquired from scan line N, the data module may acquire a signal from scan line N+1. Then, while the data module is transferring or outputting the converted (digital) data from scan line N and converting the charge acquired from scan line N+1, charge may be acquired from scan line N+2. Data from each of the data modules is output to a bus based on a certain criteria, such as spatial or temporal order. Data flows from the data module through the RRB and then through the control board. In the control board, the data passes through a look up table (LUT) on the control board and then through programmable firmware, such as a Field Programmable Gate Array (FPGA) on the control board for formatting. The formatted data is then transmitted through an encoding device, such as a Fibre Channel encoding device, and through a data serialization device. Finally, the serialized electrical data is converted to a series of light pulses before the data leaves the control board through a fiber optic connection. A finite latency is maintained between when the data leaves a data module and when the data appears from the control board. The data may be re-registered at multiple points along the data path (adding one clock delay at each register, for example), and yet maintain a finite latency.

Currently, platform elements, such as the scan and data modules and control board hardware, are designed for the most demanding applications. Thus, less demanding or different applications suffer from inefficient performance. For example, vascular imaging is a demanding application for the data modules involving acquisition of very low levels of signal at high frame rates. For vascular imaging, data modules may consume more power than for other applications, such as chest radiography. Furthermore, since much of a detector is typically operated in a pipelined manner, increasing an acquisition frame rate for the detector involves optimizing multiple processes operating concurrently at comparable speeds. Thus, a simplified system and method for optimizing detector read out and acquisition frame rate would be highly desirable.

Additionally, data modules are currently designed using custom integrated circuits. Custom integrated circuits involve significant time to develop and to improve. Thus, there is a need for a system and method for achieving faster frame rates without relying on development of custom integrated circuits.

Thus, a need exists for improved x-ray image data acquisition using a digital x-ray detector.

BRIEF SUMMARY OF THE INVENTION

Certain embodiments of the present invention provide a method and system for improved x-ray image data acquisition using a digital x-ray detector. In an embodiment, the method includes defining groups of scan lines in a detector, associating data lines in the detector with the groups of scan lines, and reading image data from the groups of scan lines using the associated data lines. The scan lines are connected with a plurality of pixels.

The method may also include defining a region of interest in the detector. The pixels obtain image data regarding the region of interest. Additionally, the method may include reading the image data from at least one scan line in each of the groups of scan lines using the associated data lines. Alternatively, the method may include reading the image data from alternating groups of the scan lines using the associated data lines. The method may include binning image data from adjacent pixels read using a plurality of data lines. In an embodiment, one reading is obtained per group at any given time during reading the detector, so as to minimize the read out time (maximize the frame rate).

In an embodiment, the method includes defining a region of interest in an x-ray detector, exposing an object to x-rays to produce image data, associating groups of scan lines based on position in the x-ray detector, and reading the image data from the x-ray detector based on the groups of scan lines. The scan lines include a plurality of pixels. The method may include associating data modules with alternating groups of the scan lines. The data modules read the image data from the groups of scan lines using data lines. The method may also include simultaneously reading the image data from a scan line in each of the groups of scan lines. The method may include summing image data from adjacent pixels that are read at a same time. In an embodiment, the image data is read from the x-ray detector in a pipelined fashion. The image data may be read from the x-ray detector using a plurality of data lines that are split in a center of the detector array.

In an embodiment, an improved x-ray detector system includes an array of pixels representing image data, a plurality of scan lines connecting the array of pixels, a plurality of data lines for reading the image data from the array of pixels, and a plurality of data modules for obtaining the image data from the array of pixels. The scan lines are associated in a plurality of groups. The plurality of data modules obtain the image data along the plurality of data lines based on the groups of scan lines.

The data modules may simultaneously read image data from a scan line in each of the groups of scan lines. The data modules may also process the image data in a pipelined process. The plurality of data modules may be associated with alternating pairs of the plurality of scan lines. The system may also include readout electronics for obtaining the image data using the data modules. In an embodiment, the readout electronics sum image data signals from adjacent pixels.

In an embodiment, the system includes a data acquisition system for controlling image data acquisition from the array of pixels. The data acquisition system is capable of defining a region of interest anywhere in the array of pixels. The system may include a data acquisition system for reading the image data using the data modules. The data acquisition system communicates with a panel including split data lines (split in a center of an array of pixels, for example) to read image data using the data modules. Alternatively, the data acquisition system may communicate with a panel including data lines that run the length of the panel but do not connect to every pixel that the data lines run past. In an embodiment, the system includes a reference and regulation board for transferring image data between the data modules and an output.

In an embodiment, the system includes a data collection unit for use with a detector. The data collection unit includes a plurality of data modules for receiving data from a plurality of detector scan lines. The plurality of data modules is organized in at least one bank. The data collection unit also includes a multiplexer for multiplexing data from the plurality of data modules to an image data bus at a data interface rate faster than a data module output rate. The data interface rate may be at least twice as fast as the data module output rate. Data from the plurality of data modules may be stored in at least one holding register external to the plurality of data modules. The data collection unit may also include a plurality of registers for reading data from the plurality of data modules in a pipelined fashion.

The foregoing summary, as well as the following detailed description of certain embodiments of the present invention, will be better understood when read in conjunction with the appended drawings. For the purpose of illustrating the invention, certain embodiments are shown in the drawings. It should be understood, however, that the present invention is not limited to the arrangements and instrumentality shown in the attached drawings.

DETAILED DESCRIPTION OF THE INVENTION

Figure 1:
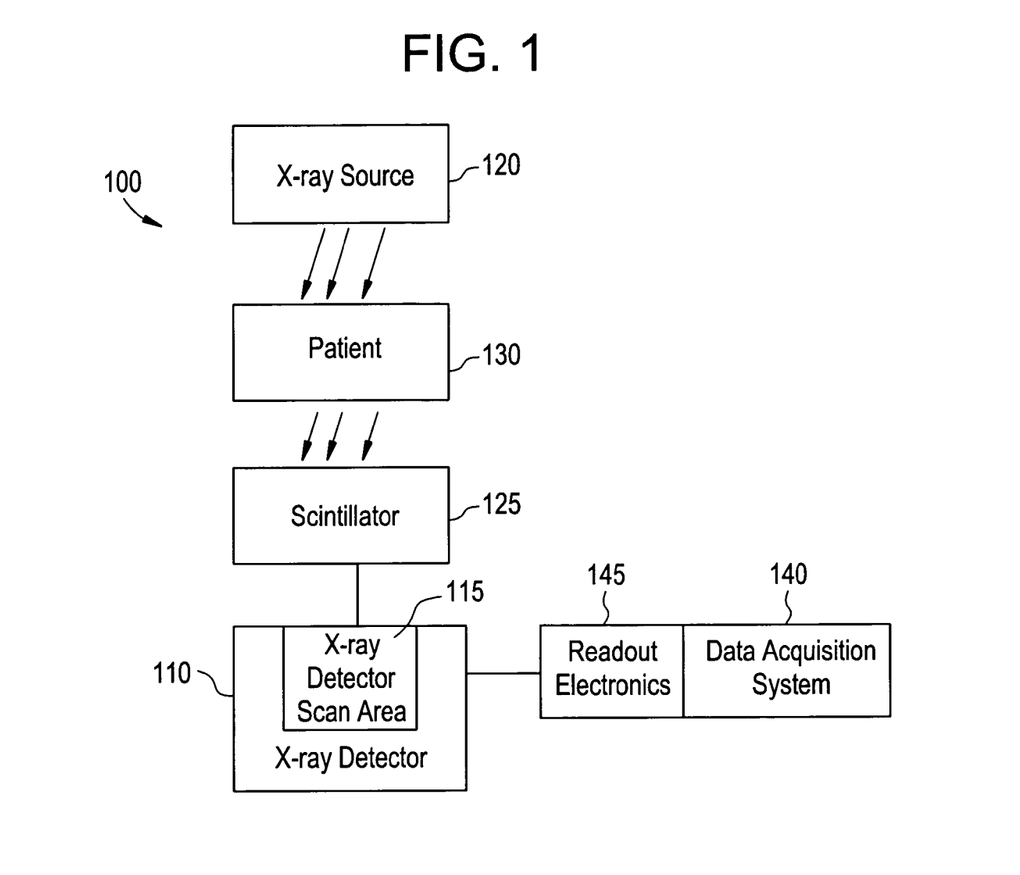
FIG. 1 illustrates an imaging system used in accordance with an embodiment of the present invention.

FIG. 1 illustrates an imaging system 100 used in accordance with an embodiment of the present invention. The imaging system 100 includes a plurality of subsystems. For the purposes of illustration, the imaging system 100 is described as an x-ray system. The imaging system 100 includes subsystems, such as an x-ray detector 110 including an array 115 of detector cells, an x-ray source 120, a scintillator 125, and an object 130. The imaging system 100 also includes a data acquisition system 140 with read out electronics 145. In an embodiment, the scintillator 125 comprises a screen positioned in front of the detector 110. In an embodiment, the detector 110 is an amorphous silicon flat panel detector. The object 130 may be a patient or another object to be imaged.

The object 130 is positioned in imaging system 100 for imaging. In one exemplary system, an x-ray source 120 is positioned above the object 130. The x-ray detector 110 is positioned below the object 130. The scintillator 125 is positioned between the object 130 and the x-ray detector 110. X-rays are transmitted from the x-ray source 120 through the object 130 to the scintillator 125. The scintillator 125 emits light in response to the x-rays transmitted from the x-ray source 120 through the object 130. The emitted light is transmitted to the x-ray detector 110 and the x-ray detector array 115. For example, light emitted by the scintillator 125 activates or discharges photodiodes in the detector array 115 to varying degrees. The read out electronics 145 may include a reference and regulation board (RRB) or other data collection unit. The RRB may accommodate and connect data modules to transfer data from the detector 110 to the data acquisition system 140. The read out electronics 145 transmit the data from the detector 110 to the data acquisition system 140. The data acquisition system 140 forms an image from the data and may store, display, and/or transmit the image.

Figure 2:
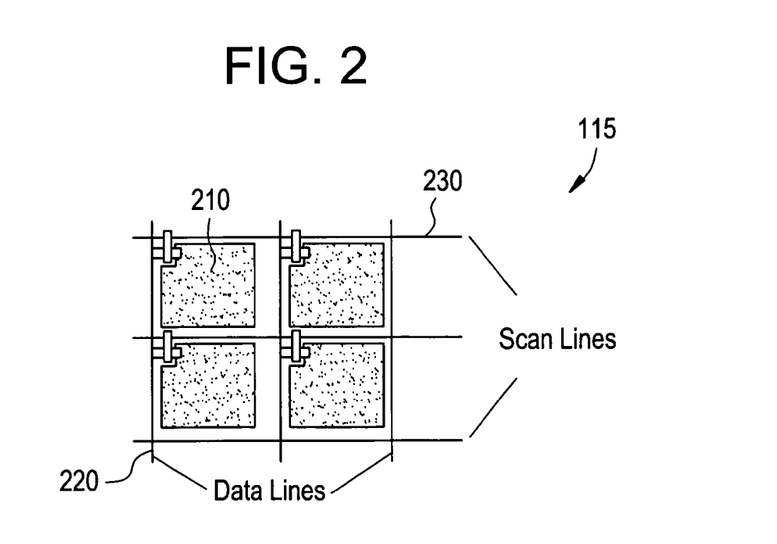
FIG. 2 illustrates an embodiment of a solid state x-ray detector array in an x-ray detector.

FIG. 2 illustrates an embodiment of a solid state x-ray detector array 115 in an x-ray detector 110. The x-ray detector array 115 is comprised of cells 210 corresponding to pixels in an x-ray image. The cells 210 may be arranged in columns 220 and rows 230. The cells 210 are controlled by scan lines along row 230 and read out by data lines along column 220. One or more cells 210 are mapped to one or more pixels in an x-ray image. The pixels are activated to produce the desired digital x-ray image of the patient 130.

Figure 3:
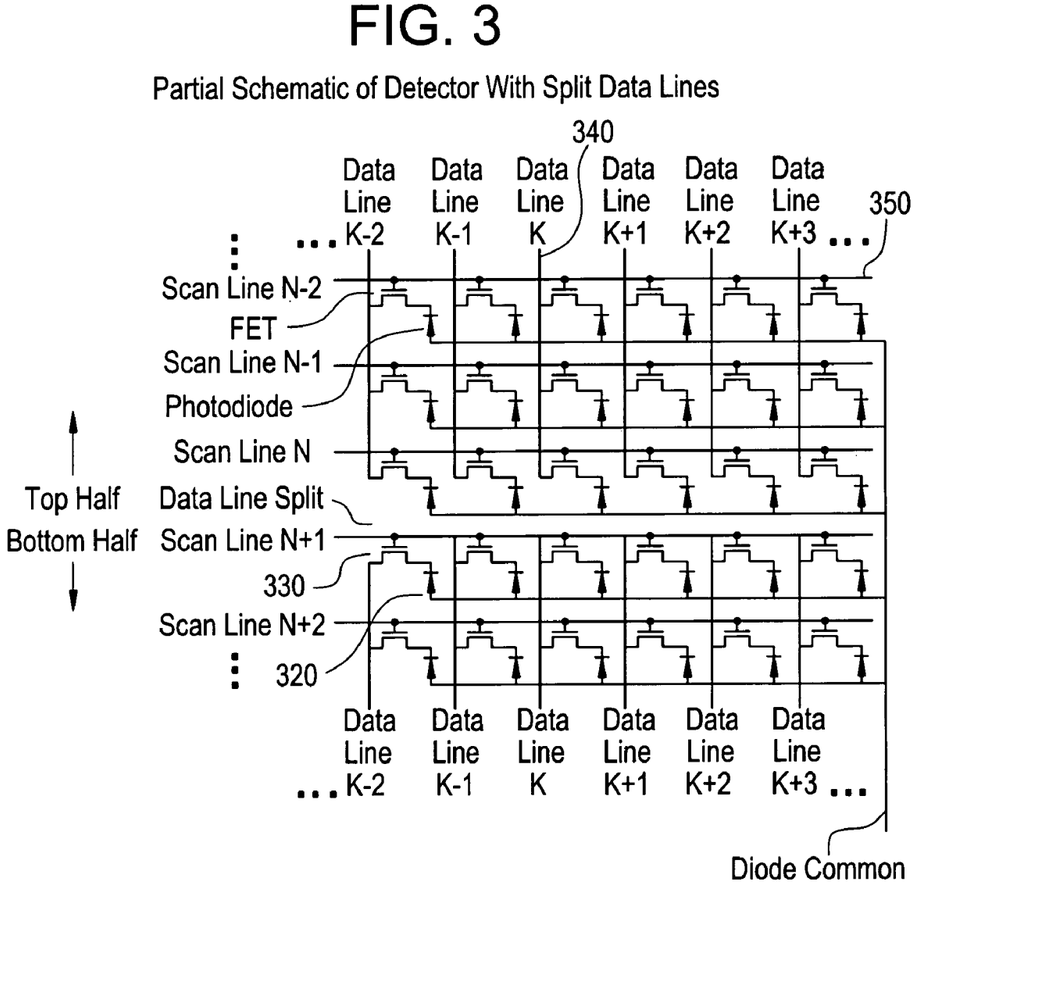
FIG. 3 illustrates a lower-level view of an embodiment of a solid state x-ray detector array within an x-ray detector.

FIG. 3 illustrates a lower-level view of an embodiment of a solid state x-ray detector array 115 within the x-ray detector 110. Each cell 210 comprises a photodiode 320 and a Field Effect Transistor (FET) 330. Data lines 340 and scan lines 350 interconnect a matrix of cells 210 in the detector array 115. Data lines 340 connect the cells 210 to the read out electronics 145 of the data acquisition system 140. A scintillator 125 is positioned above the array 115 of cells 210. The scintillator 125 emits light in response to impacting x-rays. A charge drained from a photodiode 320 corresponds to the light emitted by the area of the scintillator (and thus the x-ray intensity). Through the read out electronics 145, the data acquisition system 140 acquires x-ray image data from the x-ray detector array 115.

The data acquisition system 140 may acquire x-ray image data from the x-ray detector array 115 by receiving a signal from the data lines 340 from the cells 210 in the x-ray detector array 115 via data lines 340 and data modules. The signal from the data lines 340 may be generated by charge restored to the photodiodes 320. The charge drained in the photodiodes 320 may result from absorption of light by the photodiodes 320. The light is emitted by the scintillator 125 directly above the photodiodes 320 in response to absorption of x-ray energy by the scintillator 125. The FETs 330 allow the charge restored to the photodiodes 320 to travel as a signal through the data lines 340. The FETs 330 may be actuated by the FET controller (not shown) in the data acquisition system 140 or read out electronics 145. The signal received by the data acquisition system 140 may include an offset produced by the charge retention characteristics and leakage effects of the FETs 330 and the photodiodes 320.

Data modules in the detector 110 are used in conjunction with the read out electronics 145 to acquire image data signals from cells in the detector array 110. Doubling a number of data modules and data lines in the detector 110 doubles a rate of throughput of data from the detector 110 to the data acquisition system 140. However, an output rate of a single data module that occupies a data bus on the reference and regulation board (RRB) of the read out electronics 145 remains the same. Furthermore, the additional data modules may acquire signals from other sources aside from existing data lines, which are populated by the existing data modules.

In an embodiment, an improved detector panel 110 provides connections for additional data modules. Furthermore, scan lines in the detector array 115, previously grouped into two geometrically distinct sets of scan lines (a top half and a bottom half, for example, as shown in FIG. 3), are subdivided into additional regions. For example, the scan lines of the array 115 are divided into four scan line regions. The four scan line regions form alternating odd and even "pairs".

Figure 4:
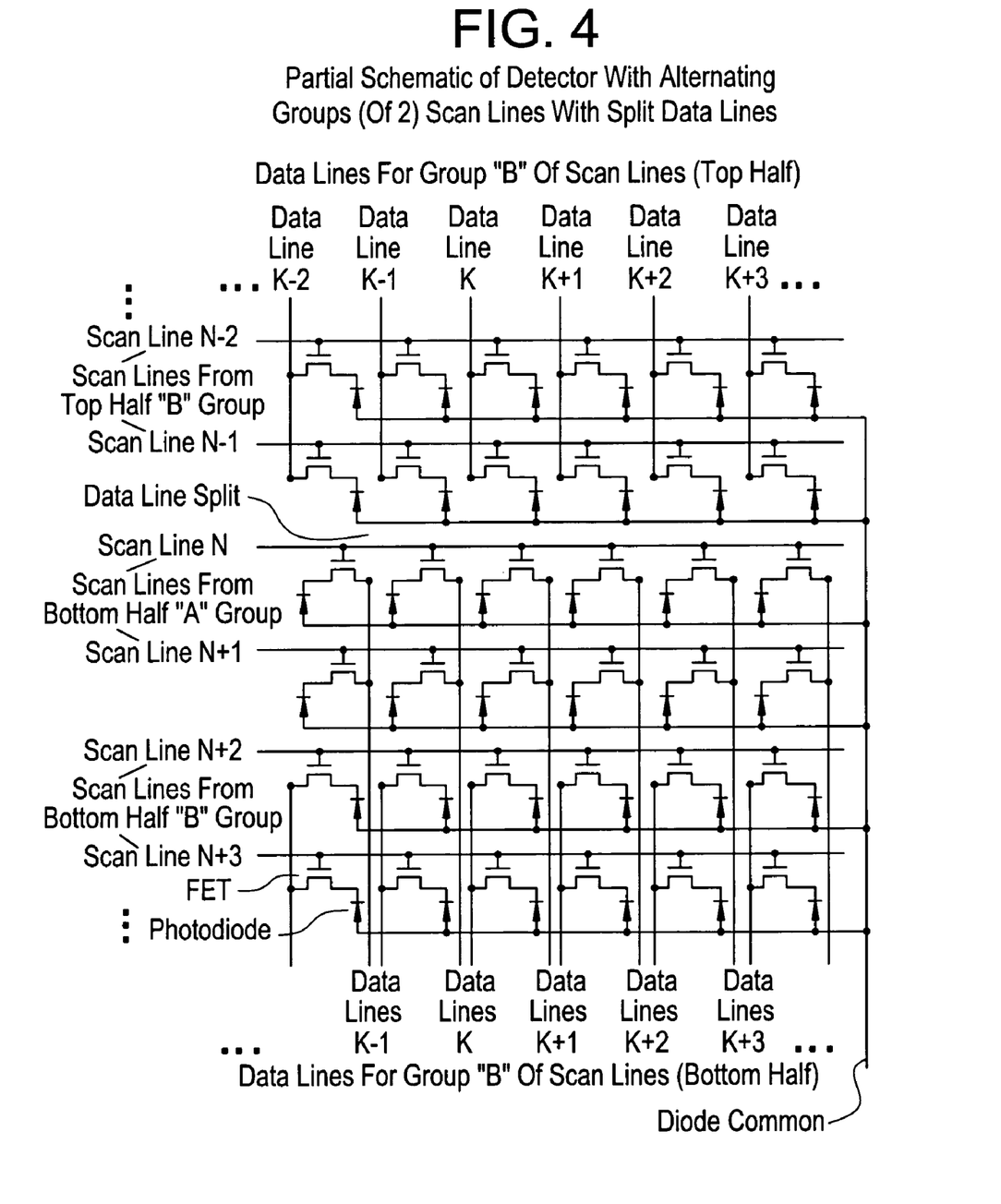
FIG. 4 illustrates an improved detector array including alternating pairs of scan lines in accordance with an embodiment of the present invention.

FIG. 4 illustrates an improved detector array 115 including alternating pairs of scan lines in accordance with an embodiment of the present invention. A bottom half of the detector array 115, for example, includes at one edge of the array 115 two scan lines (N, N+1) associated with a first group or region (group A) followed by two scan lines (N+2, N+3) associated with a second group (group B), followed by two scan lines from group A, two scan lines from group B, etc. A top half of the detector array 115 may be similarly subdivided among groups A and B. In an embodiment, each group of scan lines is associated with a set of data lines and data modules.

Figure 5:
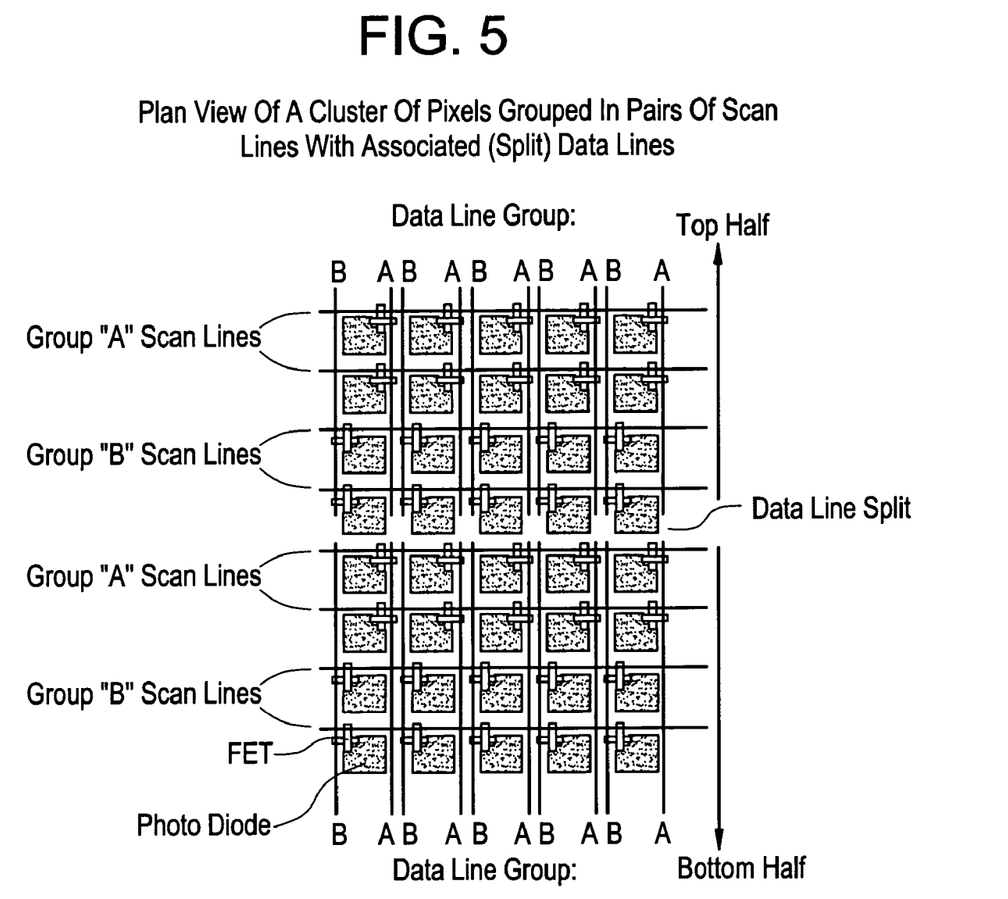
FIG. 5 depicts clusters of pixels grouped in pairs of scan lines with associated split data lines used in accordance with an embodiment of the present invention.

FIG. 5 depicts clusters of pixels grouped in pairs of scan lines with associated split data lines used in accordance with an embodiment of the present invention. In an embodiment, alternating groups are serviced by separate read out electronics 145. Thus, a field of view that is defined to be less than all of the panel 110 but is centered about a split in the data lines may utilize an approximately same number of operational cycles from all sets of data modules of the read out electronics 145. Alternatively, if scan lines are grouped into four separate regions, a field of view defined to be a center "half" of the panel 110 leaves half of the read out electronics 145 idle, utilizing no less time than to read the whole panel 110 with all of the read out electronics 145. Extending data lines to the middle of the panel 110 and alternating pairs of scan lines associated with separate data lines and read out electronics 145 provides an advantage in read time for a smaller field of view.

In an embodiment, two data lines, for example, rather than a single data line, may run between pixels on the detector 110, as shown in FIG. 5. Four scan lines, for example, rather than two scan lines, may be activated simultaneously to read out data on the data lines. The four scan lines include one scan line from each group in the detector array 115. For example, one scan line is associated with group A on the top half of the detector array 115, one scan line is associated with group B on the top half of the array 115, one scan line is associated with group A on the bottom half, and one scan line is associated with group B on the bottom half. One scan line from each group in each half of the detector array 115 may be activated and read out along the data lines by the readout electronics 145.

By assigning scan lines to alternating groups of cells or pixels in the detector array 115, faster data acquisition rates may be achieved by activating both scan lines in each pair simultaneously. A "sum" function may be implemented in the data modules to combine signals from four adjacent pixels, for example, that are read at the same time. Thus, the time to read the detector 110 is further reduced, and the acquisition frame rate is increased. By combining four signals, the "imaged" pixel become four times the size of the detector's intrinsic pixel.

A read time advantage may be realized in either binned or non-binned read out mode. In binned mode, two adjacent scan lines are activated simultaneously. In an embodiment, scan lines alternate in pairs, and two adjacent scan lines in a pair may be activated simultaneously, as in binned mode. Similarly, the read out electronics 145 may sum signals from adjacent data lines in binned mode. Binning allows more of the detector array 115 to be read in less time. However, resolution may be limited in binning mode. Reading four pixels that are binned (two adjacent pixels from each of two adjacent scan lines, for example) takes a same amount of time as reading one non-binned pixel. However, since a signal from four pixels is combined to effectively form a larger combined pixel, spatial resolution is not as fine as with individual pixel signals. In an embodiment, binning is supported with scan lines grouped in pairs.

Interleaving groups of pixels in the detector array 115 improves speed in reading a region of interest that is smaller than the whole array 115. In an alternative embodiment, additional data modules may be added to shorten at least some of the data lines in the detector array 115. Shorter data lines provide less resistance and less capacitance, resulting in lower noise. Data line contacts are then formed at an edge of the detector 110. Defining four non-interleaved sets of scan lines, two on either side of a center and two on opposite edges of the array 115, for example, may result in shorter data lines for outer regions and longer data lines for regions on either side of the center. Longer data lines may produce additional noise in the center of a resulting image as compared to the edges. Interleaving two scan lines from alternating groups, however, provides data lines of the same length.

When a region of interest in the center of the array 115 that is smaller than the entire array 115 is defined, all of the data modules in the read out electronics 145 may be used to read an image. Thus, an increase in speed is maintained regardless of the size of the region of interest. However, a shorter data line design may not enjoy a speed advantage for a smaller region of interest. In current systems, a collimator and x-ray tube focal spot are directed to the center of the detector 110. Thus, a smaller region of interest may include the center but not the edges. The edges are adjacent to the data lines contacts connecting the data modules to the detector 110. Advances in fabrication of the detector 110, such as use of less resistive data line metals, along with improved structuring of detector elements, has reduced the resistance and capacitance of data lines. Thus, noise caused by longer data lines is reduced.

The detector 110 may allow a region of interest to be defined anywhere within the detector array 115. In an embodiment, rather than centering a region of interest along a split in the data lines, the split in the data lines may be removed. Rather than two groups of scan lines in the bottom half of the array 115 and two groups of scan lines in the top half of the array 115, four rotating groups of two scan lines are defined, for example. For example, groups A, B, C, and D are defined.

Figure 6:
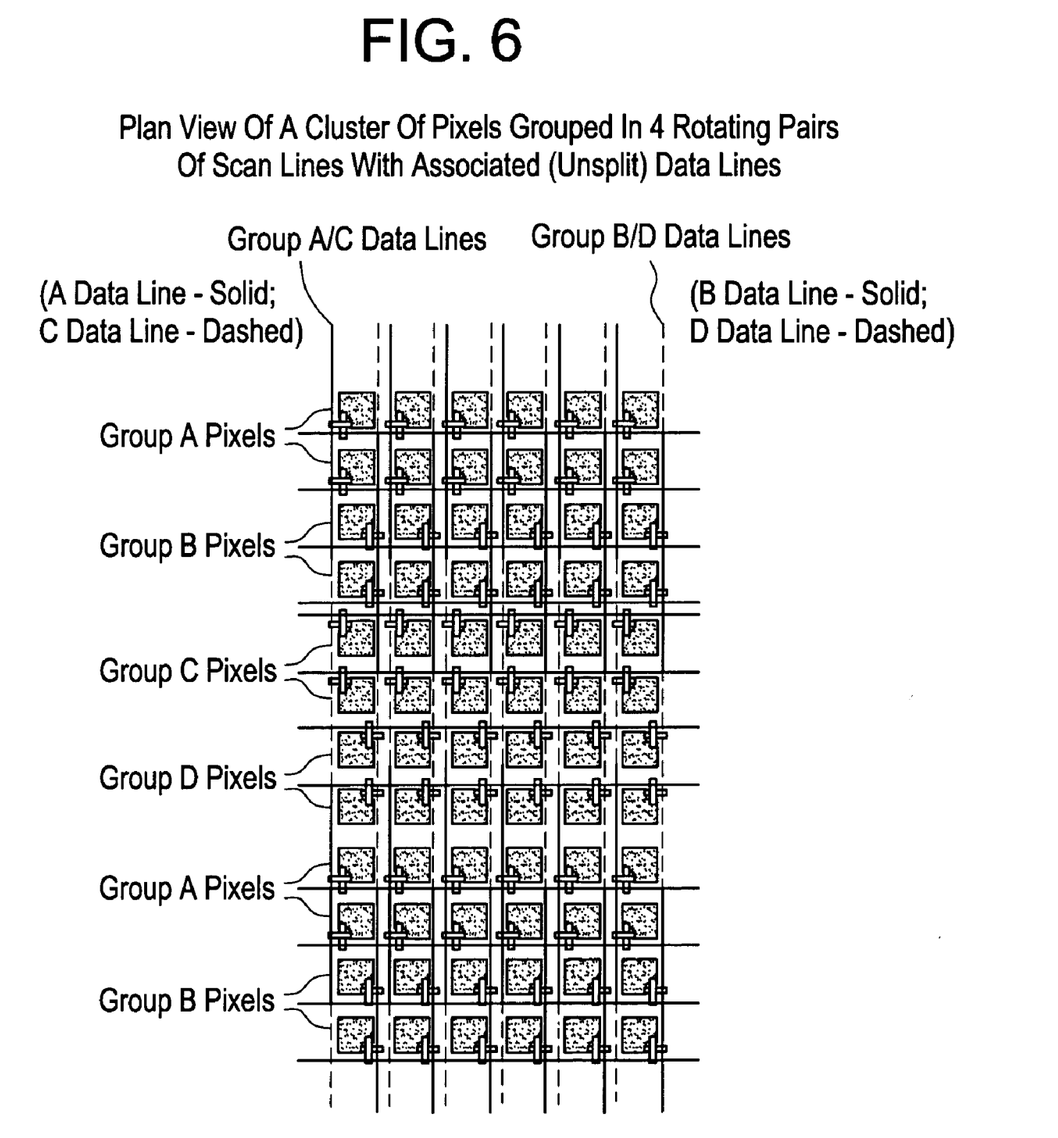
FIG. 6 illustrates a cluster of pixels grouped in four rotating pairs of scan lines with associated (unsplit) data lines used in accordance with an embodiment of the present invention.

FIG. 6 illustrates a cluster of pixels grouped in four alternating pairs of scan lines with associated (unsplit) data lines used in accordance with an embodiment of the present invention. Starting at an edge of the detector array 115, two scan lines from group A are followed by two scan lines from group B. Two scan lines from group B are followed by two scan lines from group C. Two scan lines from group C are followed by two scan lines from group D. Two scan lines from group D are followed by two scan lines from group A. Groups alternate until an opposite edge of the array 115 is reached.

In an embodiment, each group of scan lines is serviced by a separate set of data modules. As shown in FIG. 6, each data line represented in FIG. 6 includes two data lines positioned on top of each other. Alternatively, four data lines may be stacked to read out image data. Stacking four data lines allows a photodiode to occupy more space in the array 115 and therefore collect more light. However, stacking data lines adds more layers to the detector array 115.

Regardless of where the region of interest is defined, all of the data modules are engaged in reading out the detector array 115, even if the region of interest does not include the center of the array 115. If data lines are spilt, then a region of interest may be defined on one half of the array 115 with half of the data modules engaged in reading the detector 110. In an embodiment, a field of view or region of interest defined anywhere on the panel 110 uses at most two additional operational cycles from one, two, or three sets of read out electronics 145 than it would for the remaining set or sets of read out electronics. If a defined field of view includes a number of scan lines evenly divisible by eight, for example, four sets of read out electronics 145 operate in a same number of cycles to read the defined field of view in either binned or non-binned read out mode.

In an embodiment, data modules of the read out electronics 145 are attached to the detector panel 110 in two rows. In a split data line design, one row accommodates group A data modules for half of the array 115. The second row accommodates group B data modules for half of the array 115. In a non-split data line design, an inner row of contacts on an edge of the detector 110 accommodates group A data modules, and an outer row of contacts accommodates group B data modules. Another edge of the detector 110 includes inner and outer rows of contacts to accommodate groups C and D.

Figure 7:
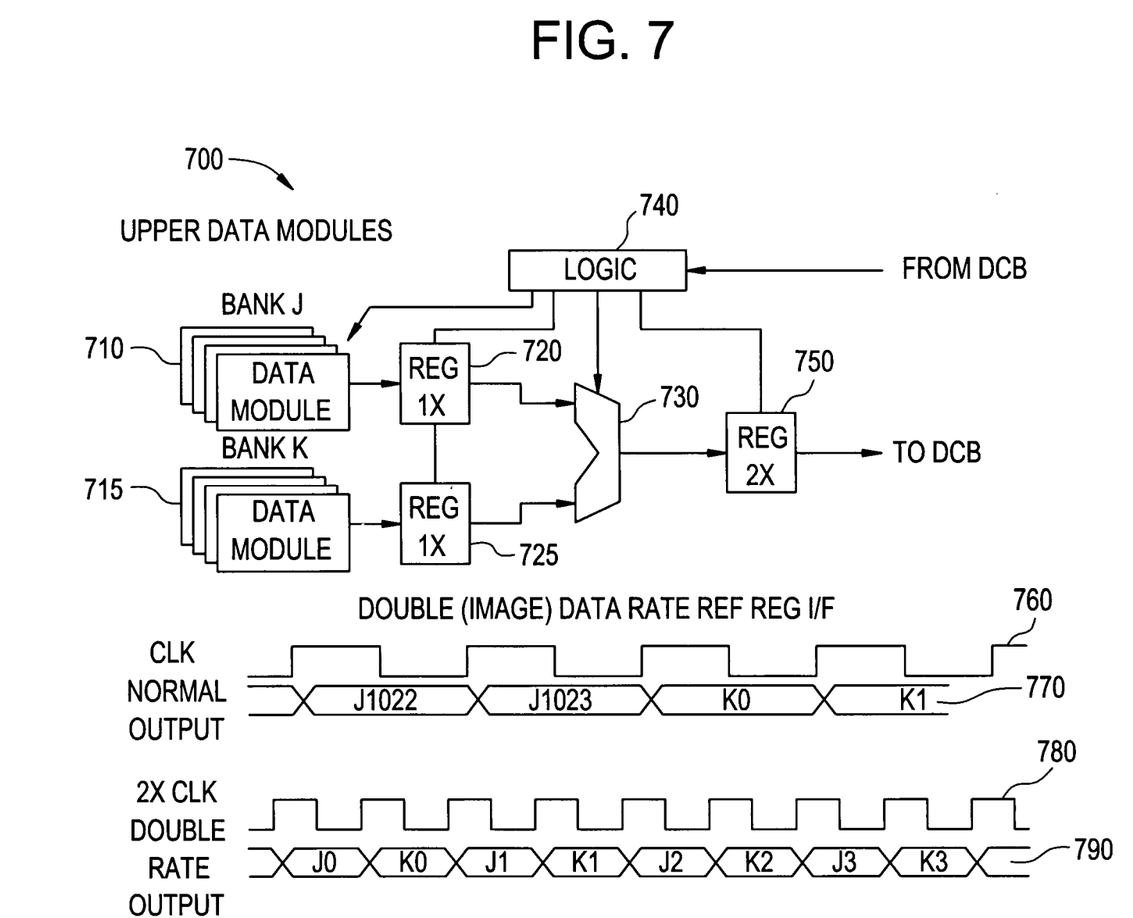
FIG. 7 illustrates a detector reference and regulation board (RRB) for read out electronics used in accordance with an embodiment of the present invention.

FIG. 7 illustrates a detector reference and regulation board (RRB) 700 of the read out electronics 145 used in accordance with an embodiment of the present invention. The RRB 700 or other data collection unit for the detector 110 accommodates and connects the data modules with a modified output pipeline to provide increased transfer or output speed. To increased data output speed, data in the RRB 700 is re-registered or stored in a holding register external to the data module. Data is re-registered at the same rate that the data is output from the data modules in the detector 110. Then, the data is multiplexed at a rate that is twice the data module output rate. The data is multiplexed onto an image data bus in the interface between the RRB 700 and a control board of the read out electronics 145. In an alternative embodiment, the control board may be implemented using optical components, for example, to increase data transfer rate. The RRB 700 transfers data at an improved data interface rate, such as twice a conventional interface rate. The control board may be programmed to function with a single rate detector and/or a double rate detector.

As shown in FIG. 7, data modules may be divided into two banks 710, 715 (Bank J and Bank K, for example). Data from data modules in each bank 710, 715 is stored in a holding register 720, 725. The data stored in the holding registers 720, 725 is multiplexed at the multiplexor 730. The multiplexor 730 allows data from the holding registers 720, 725 to be transmitted to an image data register 750 based on input from the read out logic unit 740. The logic unit 740 helps control which data modules and data lines are read from the detector 110 and which data is stored in the registers 720, 725, 750 for transfer.

FIG. 7 also illustrates timing diagrams for detector 110 read out in accordance with an embodiment of the present invention. Output 770 illustrates a normal output based on a single clock 760. Output 790 shows a double data module read output with a clock signal running at twice the rate of the clock 760. The increased clock 780 and output rate 790 allow faster image data acquisition from the detector 110.

In certain embodiments, an imaging system detector includes twice the number of detector readout channels as in prior systems. Therefore, a detector panel readout may occur in half the time of prior detector panel readouts, as illustrated by output 790, for example. By alternating among groups of pixels, greater speed may be attained than by splitting an array of pixels into two parts. A larger number of divisions in a detector array that are evenly distributed allow an operator or a readout program to better isolate an area of interest.

In an embodiment, adding data modules to the detector panel 110 may result in twice a number of connections of a typical detector panel. Two rows of contacts for each data module may be placed at the top and bottom of the detector panel 110. A set of data modules may be bound to each row of contacts on top and bottom of the panel 110.

In an embodiment, data modules may implement pipelined processing of image data signals from the detector array 115. For example, a data module may receive a signal from scan line N. At the same time, the data module may be converting an analog signal from scan line N−1 to digital data. Additionally, the module may be outputting converted digital data from scan line N−2 for processing by the data acquisition system 140. Data modules may accommodate integrated data signal inputs and may also serve to integrate signal inputs in the data modules for processing.

A scan line driver may be implemented like a serial shift register with high voltage outputs, for example. The detector panel 110 may have two sets of scan drivers: one set of scan drivers for a top of the detector panel 110 and one set of scan drivers for a bottom of the detector panel 110. Scan drivers at the top of the detector 110 read down through the detector 110, and drivers at the bottom of the detector 110 read up through the detector 110. In an embodiment, four bits may be shifted (1010, for example), rather than a single bit, to activate two scan lines simultaneously. The bits may be shifted by one to activate another pair of scan lines in the detector array 1115. Thus, the system 100 may determine which detector elements are activated based on which bits are switched into the scan line drivers.

Thus, a time to read a large, fine pitch solid state x-ray detector in applications involving higher acquisition rates is minimized. Therefore, a nominal frame rate of an image acquisition is effectively doubled. An increase in frame rate is also maintained for imaging and data read out of regions of interest that are smaller than the detector array 115 and that may not be centered about the length of a data line. Additionally, another increase in frame rate (by a factor of four, for example) may be attained by binning adjacent pixels in applications where intrinsic spatial resolution of the detector panel 110 is not important.

Figure 8:
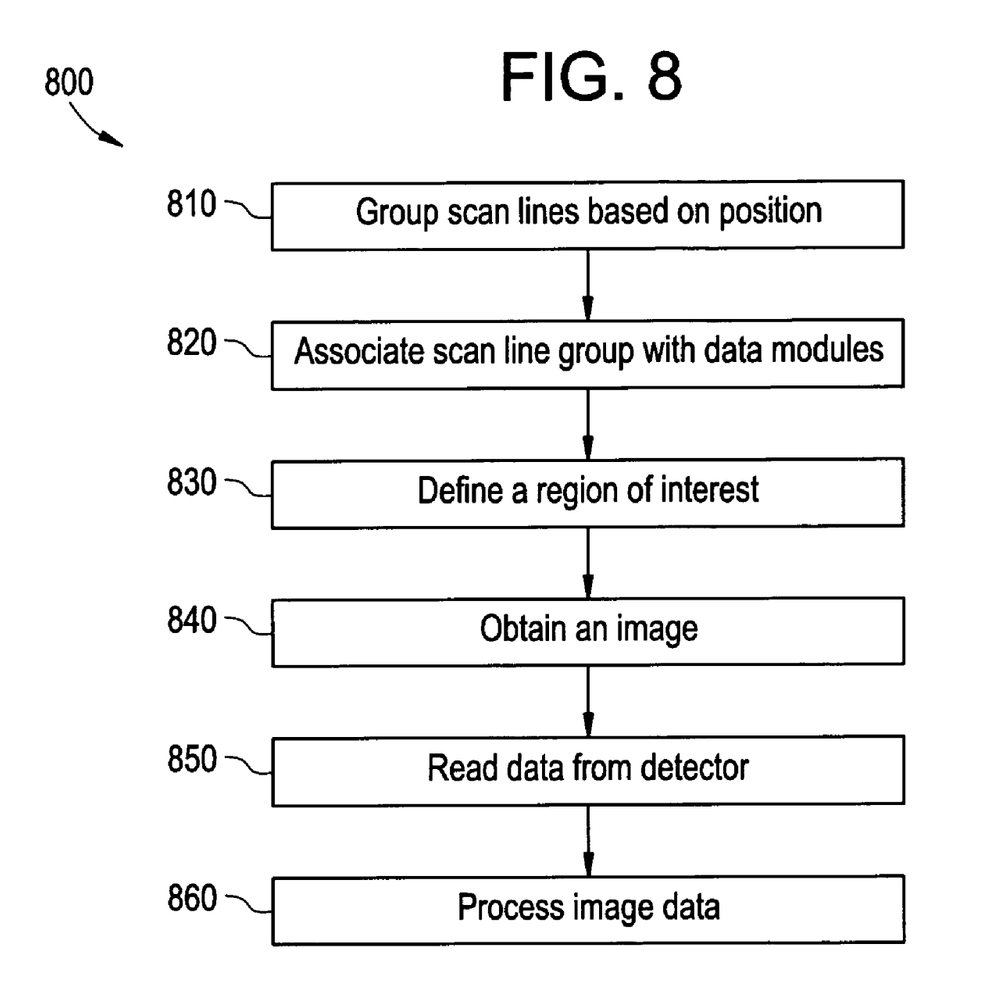
FIG. 8 depicts a flow diagram for a method for improved data acquisition for a region of interest in a digital x-ray detector used in accordance with an embodiment of the present invention.

FIG. 8 depicts a flow diagram for a method 800 for improved data acquisition for a region of interest in a digital x-ray detector 110 used in accordance with an embodiment of the present invention. First, at step 810, scan lines of the detector array 115 are grouped based on position on the detector panel 110. For example, adjacent pairs of scan lines on a half of the detector array 115 are grouped for data read out.

Then, at step 820, groups of scan lines are associated with one or more data modules. The data modules utilize data lines to read out data from pixels on activated scan lines in an associated group. Grouping scan lines allows multiple data modules to be simultaneously activated to read out data from the detector 110. Read out of multiple scan lines at a time over additional data lines increases acquisition frame rates. Multiple scan line read out also reduces time to scrub the detector array 115. The detector array 116 may be scrubbed to more completely restore charge or eliminate the effects of leakage that may introduce artifacts into valid image data. Data read out during scrubbing is discarded rather than used for image generation.

Next, at step 830, a region of interest is defined. The region of interest may be an entire detector panel 110 or a portion of the panel 110. The region of interest may be defined anywhere within the panel 110. Then, at step 840, an object is imaged using the imaging system 100. X-rays irradiate the object and impact a scintillator to discharge photodiodes 320 in the panel 110. X-rays may irradiate the entire object or a portion or region of interest of the object to discharge the photodiodes 320 in proportion to the intensity of incident x-rays on the scintillator.

Next, at step 850, data is read from the detector panel 110. Data from different groups may be simultaneously read out using a plurality of data modules and data lines. For example, four groups of scan lines may be defined. One scan line from each of the four groups may be simultaneously read out from the detector array 115. Multiple scan line read out each using all of the associated data lines increases acquisition frame rate for the imaging system 100.

Then, at step 860, image data is processed. The image data may be processed to form an image for display and/or storage, for example. Artifacts and other errors may be eliminated in the image data. A region of interest may be identified in the image data. Image data may be combined, magnified, or otherwise processed, for example. Multiple scan line read out may result in larger combined pixels in an image. An image may be generated from the image data and displayed, printed, transmitted, and/or stored.

Thus, certain embodiments of the present invention allow large, fine pitch solid state x-ray detectors to be applied to applications involving faster acquisition frame rates than conventional detectors, such as bi-plane or pediatric applications. Certain embodiments provide a system and method that support identification and imaging of regions of interest anywhere on the detector at an increased frame rate. Thus, certain embodiments provide faster detector read out and greater control over a region of interest of an object being imaged.

Certain embodiments minimize time to read an x-ray detector array by increasing frame rate through multiple scan line read out. Time to read a region of interest smaller than the entire detector array 115 is also minimized. Regions of interest not centered about the length of a data line also benefit from minimized data read out time. In an embodiment, an additional increase in frame rate may be attained by binning adjacent pixels in applications not using intrinsic spatial resolution of the detector panel 110, regardless of an area size or location imaged in the detector array 115.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

The invention claimed is:

1. A method for data acquisition in an imaging system, said method comprising:
    defining groups of scan lines in a detector, said scan lines connected with a plurality of pixels;
    associating data lines in said detector with said groups of scan lines;
    reading image data from said groups of scan lines using a plurality of said associated data lines; and
    pipelined processing of said image data read using said plurality of associated data lines.

2. The method of claim 1, further comprising defining a region of interest in said detector, wherein said pixels obtain image data regarding said region of interest.

3. The method of claim 1, further comprising reading said image data from at least one scan line in each of said groups of scan lines using said associated data lines.

4. The method of claim 1, further comprising reading said image data from alternating groups of said scan lines using said associated data lines.

5. The method of claim 1, further comprising binning image data from adjacent pixels read using a plurality of data lines.

6. A method for obtaining image data for a region of interest in an x-ray detector, said method comprising:
    defining a region of interest in an x-ray detector;
    exposing an object to x-rays to produce image data;
    associating groups of scan lines based on position in said x-ray detector, wherein said scan lines include a plurality of pixels;
    reading said image data from said x-ray detector based on said groups of scan lines; and associating data modules with alternating groups of said scan lines, wherein each of said data modules reads said image data from at least one of said groups of scan lines using one or more data lines.

7. The method of claim 6, wherein each of said data modules reads said image data from at least one of said groups of scan lines using a plurality of data lines.

8. The method of claim 6, further comprising simultaneously reading said image data from a scan line in each of said groups of scan lines using simultaneously activated data modules.

9. The method of claim 6, further comprising summing image data from adjacent pixels that are read at a same time.

10. The method of claim 6, wherein said image data is read from said x-ray detector in a pipelined fashion.

11. The method of claim 6, wherein said image data is read from said x-ray detector using a plurality of data lines, wherein said data lines are split in a center of said detector array.

12. An x-ray detector for obtaining image data, said detector comprising:
an array of pixels representing image data;
a plurality of scan lines connecting said array of pixels, said scan lines associated in a plurality of groups;
a plurality of data lines for reading said image data from said array of pixels; and
a plurality of data modules for obtaining said image data from said array of pixels, wherein said plurality of data modules obtain said image data along said plurality of data lines based on said groups of scan lines.

13. The detector of claim 12, wherein said data modules simultaneously read image data from a scan line in each of said groups of scan lines using one or more data lines.

14. The detector of claim 12, wherein said data modules process said image data in a pipelined process.

15. The detector of claim 12, further comprising readout electronics for obtaining said image data using said data modules.

16. The detector of claim 15, wherein said readout electronics sum image data signals from adjacent pixels.

17. The detector of claim 12, further comprising a data acquisition system for controlling image data acquisition from said array of pixels, wherein said data acquisition system is capable of defining a region of interest anywhere in said array of pixels.

18. The detector of claim 12, further comprising a reference and regulation board for transferring said image data between said data modules and an output.

19. The detector of claim 12, wherein said plurality of data lines are split in a center of said array of pixels.

20. The detector of claim 12, wherein said plurality of data modules are associated with alternating pairs of said plurality of scan lines.

21. A data collection unit for collecting data from a detector array, said data collection unit comprising:
a plurality of data modules for receiving data from a sub-array of said detector array, said plurality of data modules organized in at least one bank;
a multiplexer for multiplexing data from said plurality of data modules to an image data bus at a data interface rate faster than a data module output rate.

22. The data collection unit of claim 21, wherein said data interface rate is at least twice as fast as the data module output rate.

23. The data collection unit of claim 21, wherein data from said plurality of data modules is stored in at least one holding register external to said plurality of data modules.

24. The data collection unit of claim 21, further comprising a plurality of registers for reading data from said plurality of data modules in a pipelined fashion.

* * * * *